United States Patent
Kato et al.

(10) Patent No.: US 12,278,279 B2
(45) Date of Patent: Apr. 15, 2025

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Takahiro Kato, Yokohama (JP); Tatsunori Sakano, Shinagawa (JP); Yusuke Kobayashi, Yokohama (JP); Ryohei Gejo, Kawasaki (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 376 days.

(21) Appl. No.: 17/816,827

(22) Filed: Aug. 2, 2022

(65) Prior Publication Data

US 2023/0253485 A1 Aug. 10, 2023

(30) Foreign Application Priority Data

Feb. 10, 2022 (JP) ................... 2022-019264

(51) Int. Cl.
*H01L 29/739* (2006.01)
*H01L 29/06* (2006.01)
(Continued)

(52) U.S. Cl.
CPC ...... *H01L 29/7397* (2013.01); *H01L 29/0696* (2013.01); *H01L 29/1095* (2013.01); *H01L 29/41708* (2013.01); *H01L 29/4238* (2013.01)

(58) Field of Classification Search
None
See application file for complete search history.

(56) References Cited

U.S. PATENT DOCUMENTS

| 2012/0061722 A1 | 3/2012 | Hashimoto et al. |
| 2014/0077293 A1* | 3/2014 | Kitagawa ......... H01L 29/66348 257/330 |

(Continued)

FOREIGN PATENT DOCUMENTS

| JP | 2006-210535 A | 8/2006 |
| JP | 5674530 B2 | 2/2015 |

(Continued)

OTHER PUBLICATIONS

Machida et al., "Approaching the Limit of Switching Loss Reduction in Si-IGBTs," IEEE 26th International Symposium on Power Semiconductor Devices & IC's, 2014, 4 Pages.

(Continued)

*Primary Examiner* — Michelle Mandala
(74) *Attorney, Agent, or Firm* — Oblon, McClelland, Maier & Neustadt, L.L.P.

(57) ABSTRACT

According to one embodiment, a semiconductor device includes first to fourth electrodes, a semiconductor member, and an insulating member. The semiconductor member includes first to sixth semiconductor regions. The third semiconductor region includes first and second partial regions. A part of the fourth semiconductor region is between the second partial and second semiconductor regions. The fifth semiconductor region is between the second partial region and a part of the fourth semiconductor region. The sixth semiconductor region is between the first electrode and the first semiconductor region. The second electrode is electrically connected to the second semiconductor region. The fourth electrode is between the first partial region and the third electrode. A part of the insulating member is provided between the semiconductor member and the third electrode, between the semiconductor member (Continued)

and the fourth electrode, and between the third and fourth electrodes.

20 Claims, 7 Drawing Sheets

(51) Int. Cl.
  *H01L 29/10* (2006.01)
  *H01L 29/417* (2006.01)
  *H01L 29/423* (2006.01)

(56) References Cited

U.S. PATENT DOCUMENTS

| | | | |
|---|---|---|---|
| 2015/0179764 A1* | 6/2015 | Okumura | H01L 29/66 438/270 |
| 2019/0088769 A1 | 3/2019 | Matsushita | |
| 2019/0123186 A1 | 4/2019 | Philippou et al. | |
| 2022/0085209 A1* | 3/2022 | Tomita | H01L 29/456 |
| 2023/0122519 A1* | 4/2023 | Nagata | H01L 29/41741 257/771 |

FOREIGN PATENT DOCUMENTS

| | | |
|---|---|---|
| JP | 2017-028250 A | 2/2017 |
| JP | 2019-012813 A | 1/2019 |
| JP | 2019-57702 A | 4/2019 |
| JP | 2019-91892 A | 6/2019 |

OTHER PUBLICATIONS

Sandow et al., "IGBT with Superior Long-Term Switching Behavior by Asymmetric Trench Oxide", IEEE 30th International Symposium on Power Semiconductor Devices & IC's, 2018, 4 Pages.
Japanese Office Action dated Feb. 28, 2025; issued in Japanese Application No. 2022-019264 (with English translation).

\* cited by examiner

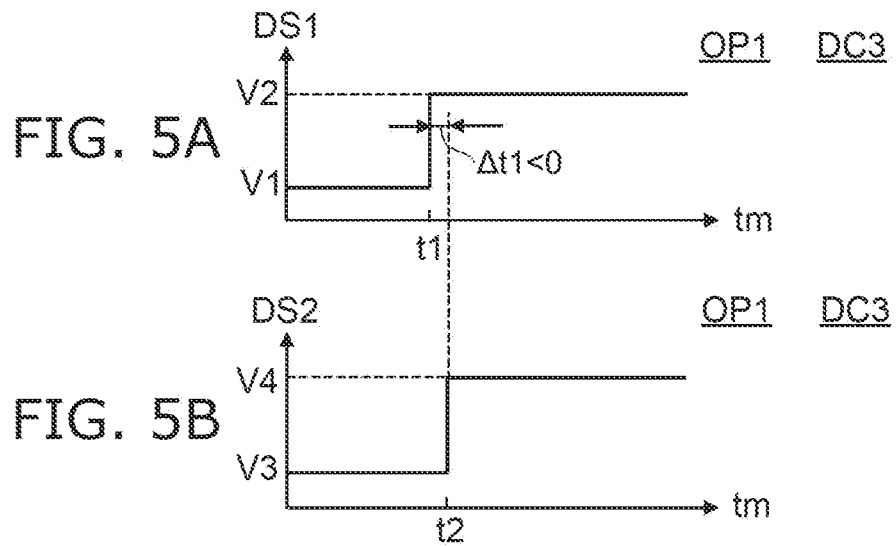
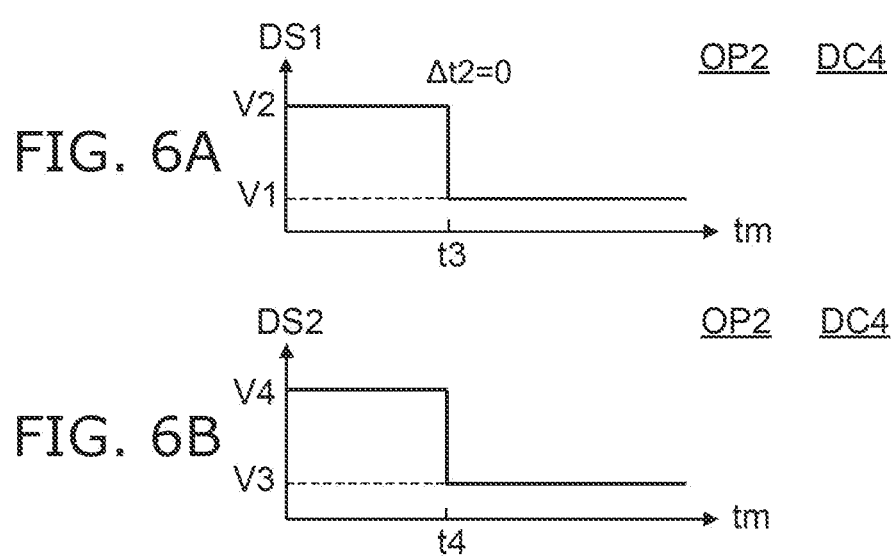

SEMICONDUCTOR DEVICE

CROSS-REFERENCE TO RELATED APPLICATIONS

This application is based upon and claims the benefit of priority from Japanese Patent Application No. 2022-019264, filed on Feb. 10, 2022; the entire contents of which are incorporated herein by reference.

FIELD

Embodiments of the invention generally relate to a semiconductor device.

BACKGROUND

For example, a semiconductor device such as an IGBT (insulated gate bipolar transistor) is used in a power conversion circuit or the like. A drive device and a semiconductor module capable of suppressing loss in a semiconductor device are desired.

BRIEF DESCRIPTION OF THE DRAWINGS

FIGS. 5A and 5B are schematic diagrams illustrating the operation of the semiconductor device according to the first embodiment;

FIGS. 6A and 6B are schematic diagrams illustrating the operation of the semiconductor device according to the first embodiment;

DETAILED DESCRIPTION

Figure 1:
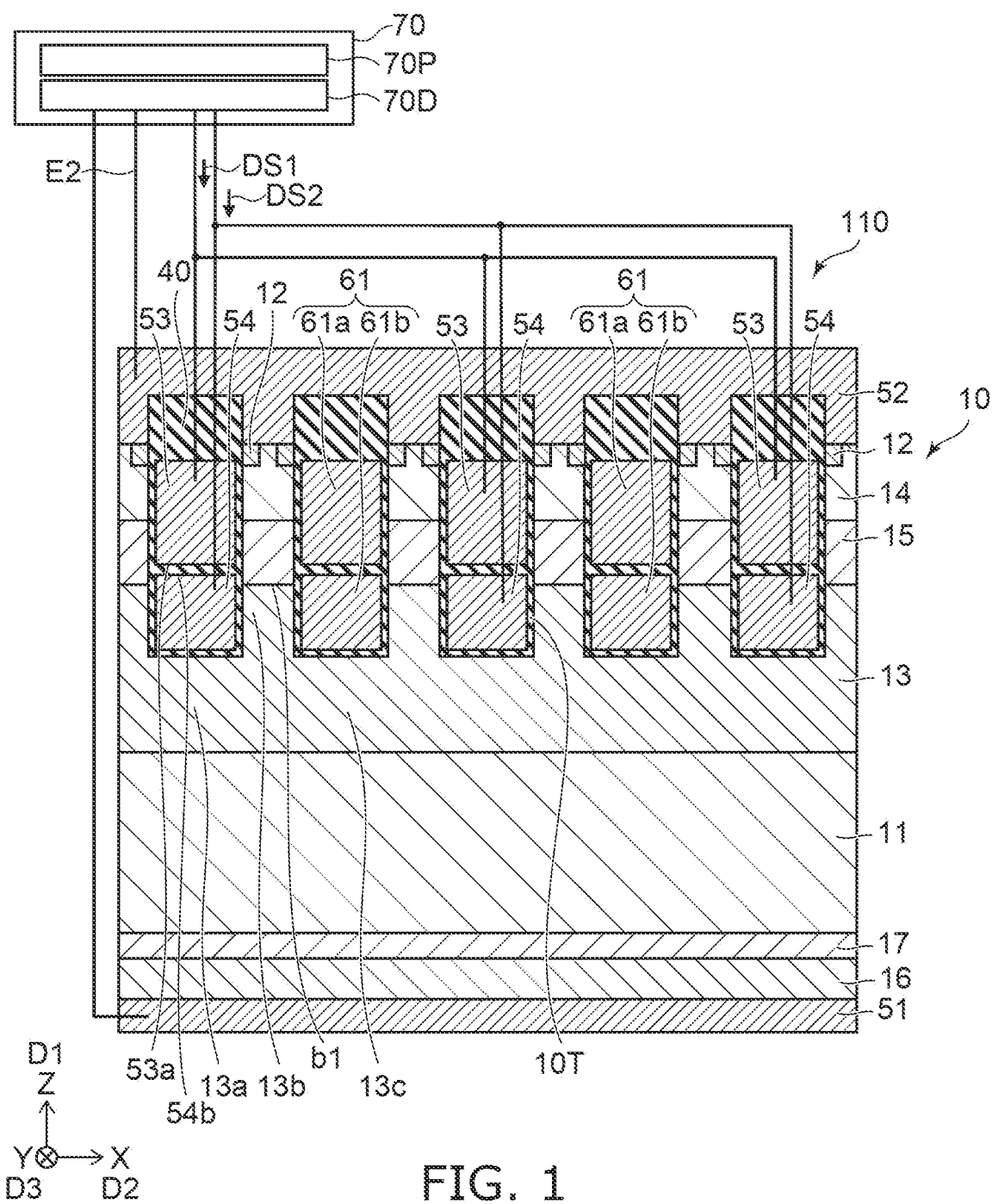
FIG. 1 is a schematic cross-sectional view illustrating a semiconductor device according to a first embodiment.

According to one embodiment, a semiconductor device includes a first electrode, a second electrode, a third electrode, a fourth electrode, a semiconductor member, and an insulating member. The semiconductor member includes a first semiconductor region being of a first conductive type, a second semiconductor region being of the first conductive type, a third semiconductor region being of a second conductive type, a fourth semiconductor region being of the second conductive type, a fifth semiconductor region being of the first conductive type, and a sixth semiconductor region being of the second conductive type. A position of the first semiconductor region in a first direction from the first electrode to the first semiconductor region is located between a position of the first electrode in the first direction and a position of the second semiconductor region in the first direction. The third semiconductor region includes a first partial region and a second partial region. The second partial region is located between the first semiconductor region and the second semiconductor region in the first direction. At least a part of the fourth semiconductor region is located between the second partial region and the second semiconductor region in the first direction. The fifth semiconductor region is located between the second partial region and at least a part of the fourth semiconductor region in the first direction. The sixth semiconductor region is located between the first electrode and the first semiconductor region in the first direction. The second electrode is electrically connected to the second semiconductor region. The first partial region is located between the first semiconductor region and the third electrode in the first direction. The third electrode overlaps the second semiconductor region, at least a part of the fourth semiconductor region, and the fifth semiconductor region in a second direction crossing the first direction. The fourth electrode is located between the first partial region and the third electrode in the first direction. A direction from the fourth electrode to the second partial region is along the second direction. At least a part of the insulating member is provided between the semiconductor member and the third electrode, between the semiconductor member and the fourth electrode, and between the third electrode and the fourth electrode.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating semiconductor device according to first embodiment.

As shown in FIG. 1, a semiconductor device 110 according to the embodiment includes a first electrode 51, a second electrode 52, a third electrode 53, a fourth electrode 54, a semiconductor member 10, and an insulating member 40.

The semiconductor member 10 includes a first semiconductor region 11 of a first conductive type, a second semiconductor region 12 of the first conductive type, a third semiconductor region 13 of a second conductive type, and fourth semiconductor region. 14 of the second conductive type, a fifth semiconductor region 15 of the first conductive type, and a sixth semiconductor region 16 of the second conductive type.

For example, the first conductive type is n type and the second conductive type is p type. In the embodiment, the first conductive type may be p type and the second conductive type may be n type. In the following, the first conductive type is n-type and the second conductive type is p-type.

A direction from the first electrode 51 to the first semiconductor region 11 is defined as the first direction D1. The first direction D1 is a Z-axis direction. One direction perpendicular to the Z-axis direction is defined as an X-axis direction. The direction perpendicular to the Z-axis direction and the X-axis direction is defined as a Y-axis direction.

A position of the first semiconductor region 11 in the first direction D1 is located between a position of the first electrode 51 in the first direction D1 and a position of the second semiconductor region 12 in the first direction D1.

The third semiconductor region 13 includes a first partial region 13a and a second partial region 13b. The second partial region 13b is located between the first semiconductor region 11 and the second semiconductor region 12 in the first direction D1.

At least a part of the fourth semiconductor region 14 is located between the second partial region 13b and the second semiconductor region 12 in the first direction D1. The fifth semiconductor region 15 is located between the second partial region 13b and at least a part of the fourth semiconductor region 14 in the first direction D1. The sixth semiconductor region 16 is located between the first electrode 51 and the first semiconductor region 11 in the first direction D1.

The second electrode 52 is electrically connected to the second semiconductor region 12.

The first partial region 13a is located between the first semiconductor region 11 and the third electrode 53 in the first direction D1. In a second direction D2 crossing the first direction D1, the third electrode 53 overlaps the second semiconductor region 12, at least a part of the fourth semiconductor region 14, and the fifth semiconductor region 15.

The second direction D2 is, for example, the X-axis direction. For example, a direction from a part of the third electrode 53 to the second semiconductor region 12 is along the second direction D2. A direction from another part of the third electrode 53 to at least the part of the fourth semiconductor region 14 is along the second direction D2. A direction from another part of the third electrode 53 to the fifth semiconductor region 15 is along the second direction D2.

The fourth electrode 54 is located between the first partial region 13a and the third electrode 53 in the first direction D1. A direction from the fourth electrode 54 to the second partial region 13b is along the second direction D2. The third electrode 53 and the fourth electrode 54 extend, for example, along a third direction D3. The third direction D3 crosses a plane including the first direction D1 and the second direction D2. The third direction D3 is, for example, the Y-axis direction.

At least a part of the insulating member 40 is provided between the semiconductor member 10 and the third electrode 53, between the semiconductor member 10 and the fourth electrode 54, and between the third electrode 53 and the fourth electrode 54.

A current flowing between the first electrode 51 and the second electrode 52 can be controlled by a potential of the third electrode 53 and a potential of the fourth electrode 54. The potential of the third electrode 53 and the potential of the fourth electrode 54 may be, for example, a potential based on a potential of the second electrode 52 (second electrode potential E2). The semiconductor device 110 is, for example, a transistor. The semiconductor device 110 is, for example, an IGBT (Insulated Gate Bipolar Transistor). The first electrode 51 functions as, for example, a collector electrode. The second electrode 52 functions as an emitter electrode, for example. The third electrode 53 functions as a first gate electrode. The fourth electrode 54 functions as a second gate electrode.

The first semiconductor region 11 functions as, for example, a drift layer. The second semiconductor region 12 functions as, for example, an emitter layer. The fourth semiconductor region 14 functions as, for example, a base layer. The fifth semiconductor region 15 functions as, for example, a barrier layer.

For example, a carrier concentration of the first conductive type in the second semiconductor region 12 is higher than a carrier concentration of the first conductive type in the first semiconductor region 11. The first semiconductor region 11 is, for example, an n$^-$-layer. The second semiconductor region 12 is, for example, an n-layer.

For example, a carrier concentration of the first conductive type in the fifth semiconductor region 15 is higher than the carrier concentration of the first conductive type in the first semiconductor region 11. The fifth semiconductor region 15 is, for example, an n-layer.

As shown in FIG. 1, the semiconductor member 10 may further include a seventh semiconductor region 17. The seventh semiconductor region 17 is of a first conductive type. The seventh semiconductor region 17 is located between the sixth semiconductor region 16 and the first semiconductor region 11 in the first direction D1. A carrier concentration of the first conductive type in the seventh semiconductor region 17 is higher than the carrier concentration of the first conductive type in the first semiconductor region 11. The seventh semiconductor region 17 is, for example, an n-layer. The seventh semiconductor region 17 is provided as needed and may be omitted.

For example, the semiconductor member 10 is provided on the first electrode 51. For example, on the first electrode 51, the sixth semiconductor region 16, the seventh semiconductor region 17, the first semiconductor region 11, the third semiconductor region 13, the fifth semiconductor region 15, the fourth semiconductor region 14, and the second semiconductor region 12 are provided in this order. A trench 10T is provided in the semiconductor member 10. The fourth electrode 54 and the third electrode 53 are provided inside the trench 10T.

In the embodiment, the third semiconductor region 13 is provided. Thereby, the electric field in the portion corresponding to the bottom of the trench 10T is relaxed. For example, dynamic avalanche is suppressed.

By providing the third semiconductor region 13 and the fourth electrode 54, for example, loss is suppressed. For example, loss can be suppressed while maintaining good switching characteristics (di/dt). For example, a trade-off between switching characteristics and loss can be improved.

For example, in a first reference example, the third semiconductor region 13 is not provided and the fourth electrode 54 is not provided. In a second reference example, the third semiconductor region 13 is not provided, but the fourth electrode 54 is provided. In a third reference example, the third semiconductor region 13 is provided, and the fourth electrode 54 is not provided. In the embodiment, the third semiconductor region 13 and the fourth electrode 54 are provided.

In the first reference example, the on-time loss Eon is, for example, 6.43 mJ, and the off-time loss Eoff is, for example, 20.9 mJ. In the second reference example, the on-time loss Eon is, for example, 5.29 mJ, and the off-time loss Eoff is, for example, 20.2 mJ. In the third reference example, the on-time loss Eon is, for example, 3.6 mJ, and the off-time loss Eoff is, for example, 20.1 mJ. In the embodiment, the on-time loss Eon is, for example, 3.45 mJ, and the off-time loss Off is, for example, 19.2 mJ.

In this way, in the embodiment, the losses can be reduced. By driving the fourth electrode 54, the gate capacitance at the time of switching is reduced. This is thought to reduce the loss. It is considered that the reduction of the gate capacitance is caused by, for example, the depletion layer being controlled by driving the fourth electrode 54.

Figure 2:
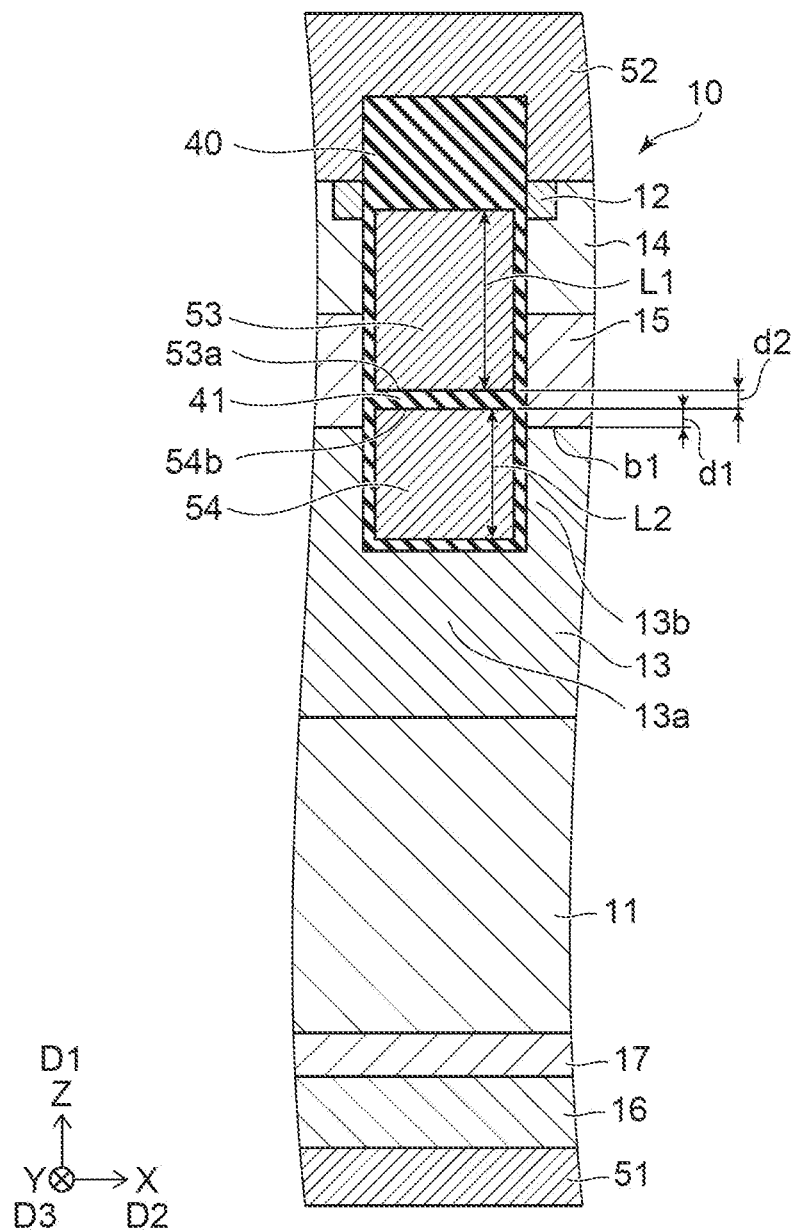
FIG. 2 is a schematic cross-sectional view illustrating a part of the semiconductor device according to the first embodiment.

FIG. 2 is a schematic cross-sectional view illustrating a part of the semiconductor device according to the first embodiment.

FIG. 2 is an enlarged view of a part of FIG. 1. As shown in FIG. 2, the third electrode 53 does not overlap the second partial region 13*b* in the second direction D2.

The insulating member 40 includes a first insulating region 41. The first insulating region 41 is provided between the third electrode 53 and the fourth electrode 54. The first insulating region 41 overlaps the fifth semiconductor region 15 in the second direction D2. The first insulating region 41 does not overlap the third semiconductor region 13 in the second direction D2. For example, a part of the fourth electrode 54 overlaps the fifth semiconductor region 15 in the second direction D2.

The third electrode 53 includes a first end portion 53*a* on a side of the fourth electrode 54. The first end portion 53*a* is, for example, a lower end of the third electrode 53. The fourth electrode 54 includes a second end portion 54*b* on a side of the third electrode 53. The second end portion 54*b* is, for example, an upper end of the fourth electrode 54. A first insulating region 41 is provided between the second end portion 54*b* and the first end portion 53*a*. A distance in the first direction D1 between the second end portion 54*b* and the first end portion 53*a* is defined as a second distance d2. The second distance d2 is a distance along the first direction S1 between the fourth electrode 54 and the third electrode 53. The second distance d2 is preferably, for example, not less than 10 nm and not more than 360 nm. The second distance d2 may be 120 nm or more. When the second distance d2 is 120 nm or more, for example, the fourth electrode 54 can be easily driven. The second distance d2 may be 480 nm or less. When the second distance d2 is 480 nm or less, for example, the gate capacitance can be easily reduced.

For example, the semiconductor member 10 includes a first boundary b1 between the second partial region 13*b* and the fifth semiconductor region 15. The first boundary b1 is below the second end portion 54*b*. A distance along the first direction D1 between a position of the first boundary b1 in the first direction D1 and a position of the second end portion 54*b* in the first direction D1 is defined as a first distance d1. The first distance d1 is preferably, for example, not less than 10 nm and not more than 200 nm. When the first distance d1 is 10 nm or more, for example, the fourth electrode 54 can be easily driven. When the first distance d1 is 200 nm or less, for example, the gate capacitance can be easily reduced.

A length of the third electrode 53 along the first direction D1 is defined as a length L1. A length of the fourth electrode 54 along the first direction D1 is defined as a length L2. The length L1 is longer than the length L2. This makes it easier, for example, to reduce the gate capacitance.

The length L1 is preferably, for example, not less than 1.5 μm and not more than 4 μm. The length L2 is preferably, for example, not less than 1.0 μm and less than 1.5 μm.

As shown in FIG. 1, the semiconductor device 110 may further include a first conductive member 61. At least a part of the second partial region 13*b* is between the fourth electrode 54 and a part of the first conductive member 61 in the second direction D2. At least a part of the fifth semiconductor region 15 and the fourth semiconductor region 14 are located between the third electrode 53 and another part of the first conductive member 61 in the second direction D2. The first conductive member 61 is electrically insulated from the third electrode 53 and electrically insulated from the fourth electrode 54. A part of the insulating member 40 is provided between the semiconductor member 10 and the first conductive member 61. The first conductive member 61 is, for example, a dummy gate. By providing the first conductive member 61, for example, the saturation current value can be lowered as compared with the case where the first conductive member 61 is not provided.

As shown in FIG. 1, in this example, the first conductive member 61 includes a first conductive portion 61*a* and a second conductive portion 61*b*. At least a part of the second partial region 13*b* is located between the fourth electrode 54 and the second conductive portion 61*b* in the second direction D2. At least a part of the fifth semiconductor region 15 and the fourth semiconductor region 14 are located between the third electrode 53 and the first conductive portion 61*a* in the second direction D2.

As shown in FIG. 1, the third semiconductor region 13 may include a third partial region 13*c*. The third partial region 13*c* is located between the first semiconductor region 11 and the first conductive member 61 in the first direction D1. For example, the second conductive portion 61*b* is located between the third partial region 13*c* and the first conductive portion 61*a* in the first direction D1. A position of the second partial region 13*b* in the second direction D2 is located between a position of the first partial region 13*a* in the second direction D2 and a position of the third partial region 13*c* in the second direction D2.

For example, a direction from the third electrode 53 to the first conductive portion 61*a* is along the second direction D2. For example, a direction from the fourth electrode 54 to the second conductive portion 61*b* is along the second direction D2. The first conductive portion 61*a* includes a material included in the third electrode 53. The first conductive portion 61*a* is, for example, the same layer as the third electrode 53. The second conductive portion 61*b* includes a material included in the fourth electrode 54. The second conductive portion 61*b* is, for example, the same layer as the 4th electrode 54.

As shown in FIG. 1, in this example, in the second direction D2, a part of the fourth semiconductor region 14 is provided between the second semiconductor region 12 and the first conductive member 61. The part of the fourth semiconductor region 14 is in contact with the second electrode 52. A part of the insulating member 40 is in contact with the part of the fourth semiconductor region 14 and the first conductive member 61 (for example, the first conductive portion 61*a*).

As shown in FIG. 1, a plurality of third electrodes 53 and a plurality of fourth electrodes 54 may be provided. The plurality of third electrodes 53 are arranged along the second direction D2. The plurality of fourth electrodes 54 are arranged along the second direction D2. A plurality of first conductive members 61 may be provided. The plurality of first conductive members 61 are arranged along the second direction D2.

As shown in FIG. 1, the semiconductor device 110 may include a controller 70. The controller 70 may include, for example, a drive circuit 70D and a power supply circuit 70P. The voltage (and current) used for driving is supplied from the power supply circuit 70P to the drive circuit 70D. The drive circuit 70D controls (switches) the voltage (and current) supplied to the electrodes.

As shown in FIG. 1, the controller 70 (for example, the drive circuit 70D) is configured to supply a first drive signal DS1 to the third electrode 53. The controller 70 (for example, the drive circuit 70D) is configured to supply a second drive signal DS2 to the fourth electrode 54. These drive signals control the potential of these electrodes (e.g., gate electrodes). As a result, the turn-on operation and the turn-off operation are performed.

Hereinafter, an example of operation by the controller 70 will be described.

Figure 3A:
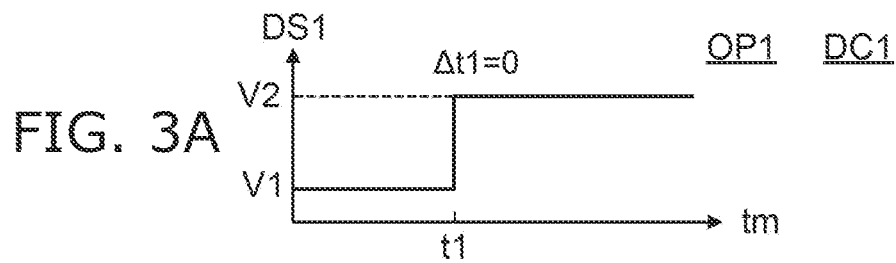
FIGS. 3A and 3B are schematic views illustrating an operation of the semiconductor device according to the first embodiment.
Figure 3B:
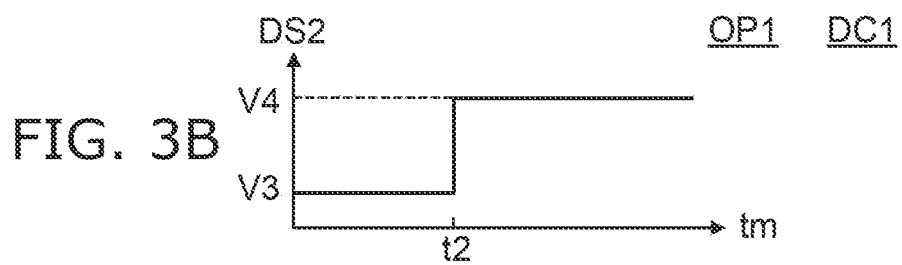

FIGS. 3A and 3B are schematic diagrams illustrating the operation of the semiconductor device according to the first embodiment.

The horizontal axis of these figures is time tm. The vertical axis of FIG. 3A is the magnitude (height) of the first drive signal DS1. The vertical axis of FIG. 3B is the magnitude (height) of the second drive signal DS2. These figures correspond to a first drive condition DC1 in a first operation OP1. The first operation OP1 corresponds to, for example, a turn-on operation.

As shown in FIG. 3A, in the first operation OP1, the first drive signal DS1 changes from a first potential V1 to a second potential V2 higher than the first potential V1. As shown in FIG. 3B, in the first operation OP1, the second drive signal DS2 changes from a third potential V3 to a fourth potential V4 higher than the third potential V3.

These potentials may be potentials based on the second electrode potential E2 (see FIG. 1). The third potential V3 may be substantially the same as the first potential V1. The fourth potential V4 may be substantially the same as the second potential V2. In one example, the first potential V1 and the third potential V3 are −15V. In one example, the second potential V2 and the fourth potential V4 are +15V.

The potential of the third electrode 53 and the potential of the fourth electrode 54 may be controlled by such a first drive signal DS1 and a second drive signal DS2. As a result, the turn-on operation is performed.

The time when the first drive signal DS1 changes from the first potential V1 to the second potential V2 is defined as a first time t1. The time when the second drive signal DS2 changes from the third potential V3 to the fourth potential V4 is defined as a second time t2. In the first drive condition DC1, a difference Δt1 (=t2−t1) between the first time t1 and the second time t2 is substantially 0. The potential of the third electrode 53 and the potential of the fourth electrode 54 are controlled substantially simultaneously.

Figure 4A:
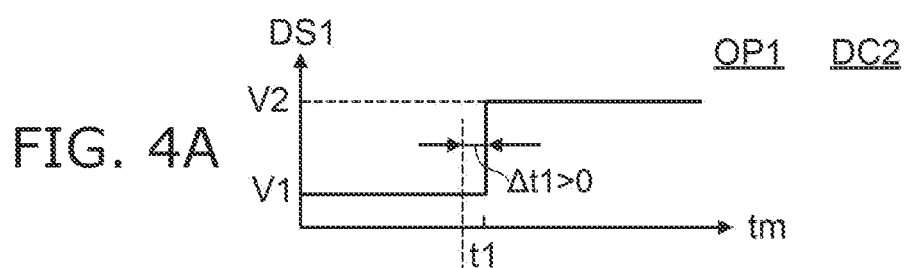
FIGS. 4A and 4B are schematic diagrams illustrating the operation of the semiconductor device according to the first embodiment.
Figure 4B:
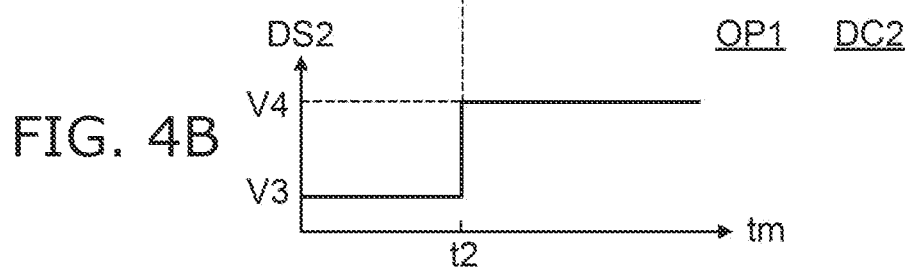

FIGS. 4A and 4B are schematic diagrams illustrating the operation of the semiconductor device according to the first embodiment.

The horizontal axis of these figures is time tm. The vertical axis of FIG. 4A is the magnitude (height) of the first drive signal DS1. The vertical axis of FIG. 4B is the magnitude (height) of the second drive signal DS2. These figures correspond to a second drive condition DC2 in the first operation OP1. In the second drive condition DC2, the first time t1 is after the second time t2. The difference Δt1 (=t2−t1) between the first time t1 and the second time t2 is negative.

FIGS. 5A and 5B are schematic diagrams illustrating the operation of the semiconductor device according to the first embodiment.

The horizontal axis of these figures is time tm. The vertical axis of FIG. 5A is the magnitude (height) of the first drive signal DS1. The vertical axis of FIG. 5B is the magnitude (height) of the second drive signal DS2. These figures correspond to a third drive condition DC3 in the first operation OP1. In the third drive condition DC3, the first time t1 is before the second time t2. The difference Δt1 (=t2−t1) between the first time t1 and the second time t2 is positive.

FIGS. 6A and 6B are schematic diagrams illustrating the operation of the semiconductor device according to the first embodiment.

The horizontal axis of these figures is time tm. The vertical axis of FIG. 6A is the magnitude (height) of the first drive signal DS1. The vertical axis of FIG. 6B is the magnitude (height) of the second drive signal DS2. These figures correspond to a fourth drive condition DC4 in the second operation OP2. The second operation OP2 corresponds to, for example, a turn-off operation.

As shown in FIG. 6A, in the second operation OP2, the first drive signal DS1 changes from the second potential V2 to the first potential V1. As shown in FIG. 6B, in the second operation OP2, the second drive signal DS2 changes from the fourth potential V4 to the third potential V3.

The potential of the third electrode 53 and the potential of the fourth electrode 54 may be controlled by such a first drive signal DS1 and a second drive signal DS2. As a result, the turn-off operation is performed.

The time when the first drive signal DS1 changes from the second potential V2 to the first potential V1 is defined as a third time t3. The time when the second drive signal DS2 changes from the fourth potential V4 to the third potential V3 is defined as a fourth time t4. In the fourth drive condition DC4, the difference Δt2 (=t4−t3) between the third time t3 and the fourth time t4 is substantially 0. The potential of the third electrode 53 and the potential of the fourth electrode 54 are controlled substantially simultaneously.

Figure 7A:
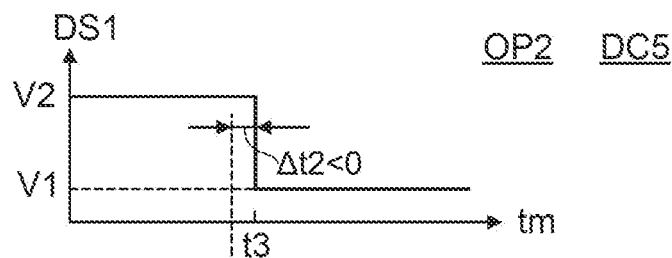
FIGS. 7A and 7B are schematic diagrams illustrating the operation of the semiconductor device according to the first embodiment.
Figure 7B:
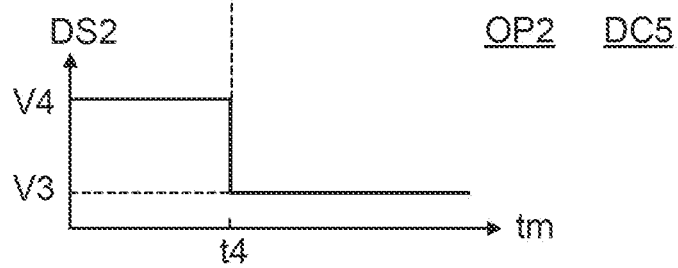

FIGS. 7A and 7B are schematic diagrams illustrating the operation of the semiconductor device according to the first embodiment.

The horizontal axis of these figures is time tm. The vertical axis of FIG. 7A is the magnitude (height) of the first drive signal DS1. The vertical axis of FIG. 7B is the magnitude (height) of the second drive signal DS2. These figures correspond to a fifth drive condition DC5 in the second operation OP2. In the fifth drive condition DC5, the third time t3 is after the fourth time t4. The difference Δt2 (=t4−t3) between the third time t3 and the fourth time t4 is negative.

Figure 8A:
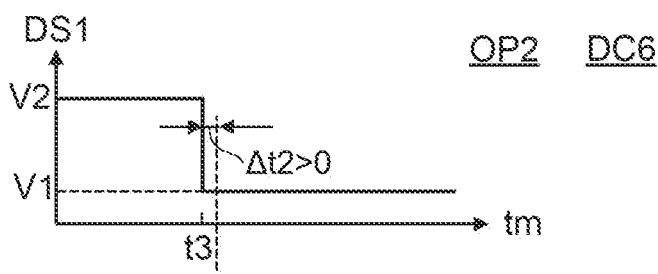
FIGS. 8A and 8B are schematic diagrams illustrating the operation of the semiconductor device according to the first embodiment.
Figure 8B:
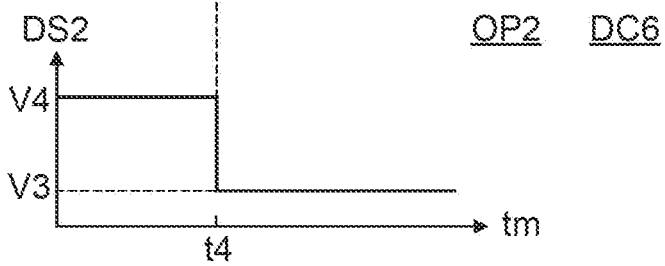

FIGS. 8A and 8B are schematic diagrams illustrating the operation of the semiconductor device according to the first embodiment.

The horizontal axis of these figures is time tm. The vertical axis of FIG. 8A is the magnitude (height) of the first drive signal DS1. The vertical axis of FIG. 8B is the magnitude (height) of the second drive signal DS2. These FIGS. correspond to a sixth drive condition DC6 in the first operation OP1. In the sixth drive condition DC6, the third time t3 is before the fourth time t4. The difference Δt2 (=t4−t3) between the third time t3 and the fourth time t4 is positive.

Figure 9:
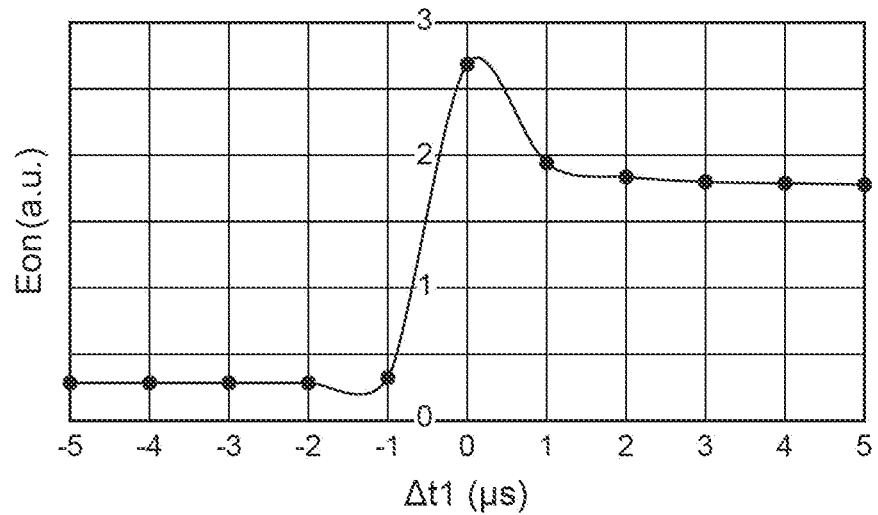
FIG. 9 is a graph illustrating the characteristics of the semiconductor device according to the first embodiment.

FIG. 9 is a graph illustrating the characteristics of the semiconductor device according to the first embodiment.

The horizontal axis of FIG. 9 is the difference Δt1 in the first operation OP1. The vertical axis is the on-time loss Eon. In this example, the on-time loss Eon is normalized. As shown in FIG. 9, the on-time loss Eon when the difference Δt1 is negative is smaller than the on-time loss Eon when the difference Δt1 is positive. This is considered to be due to, for example, that when the difference Δt1 is negative, the gate capacitance at the time of switching is smaller than when the difference Δt1 is positive.

In the embodiment, it is preferable that the first time t1 (the time when the first drive signal DS1 changes from the first potential V1 to the second potential V2) is prior to the second time t2 (the time when the second drive signal DS2 changes from the third potential V3 to the fourth potential V4). In this case, the absolute value of the difference Δt1 between the first time t1 and the second time t2 is preferably 2 μs or more. As a result, a small on-time loss Eon can be stably obtained. The absolute value of the difference Δt1 is preferably, for example, 5 μs or less. This makes it easy to operate the semiconductor device at a high frequency. For example, it becomes more advantageous when a semiconductor device is applied to an inverter or the like.

Figure 10:
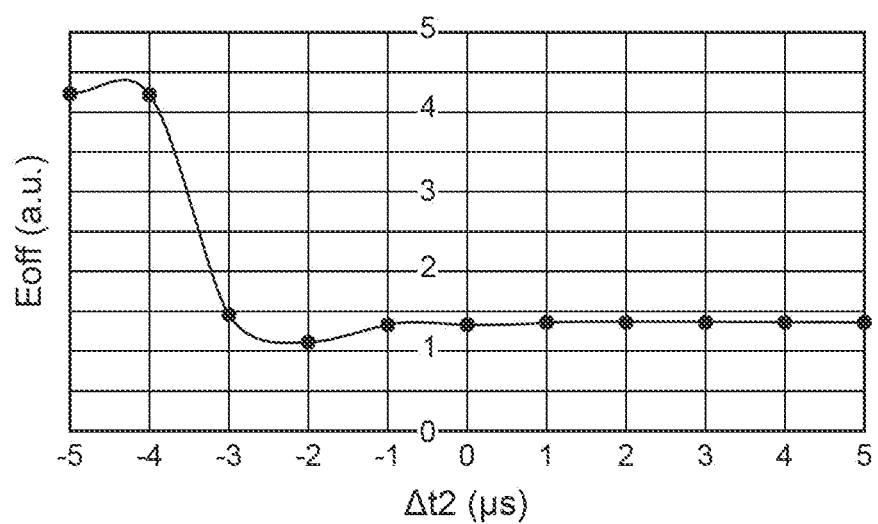
FIG. 10 is a graph illustrating the characteristics of the semiconductor device according to the first embodiment.

FIG. 10 is a graph illustrating the characteristics of the semiconductor device according to the first embodiment.

The horizontal axis of FIG. 10 is the difference Δt2 in the second operation OP2. The vertical axis is the off-time loss Eoff. In this example, the off-time loss Eoff is normalized. As shown in FIG. 10, when the difference Δt2 is positive, the off-time loss Eoff is small. Even when the difference Δt2 is positive and the absolute value of Δt2 is 3 μm or less, the off-time loss Eoff is small. This is considered to be due to the small gate capacitance during switching.

In the embodiment, it is preferable that the third time t3 (the time when the first drive signal DS1 changes from the second potential V2 to the first potential V1) is later than the fourth time t4 (the time when the second drive signal DS2 changes from the fourth potential V4 to the third potential V3). Alternatively, the third time t3 may be substantially the same as the fourth time t4. Alternatively, when the third time t3 is earlier than the fourth time t4, the absolute value of the difference between the third time t3 and the fourth time t4 is preferably 3 μs or less. Under such conditions, a small off-time loss Eoff can be stably obtained.

Figure 11:
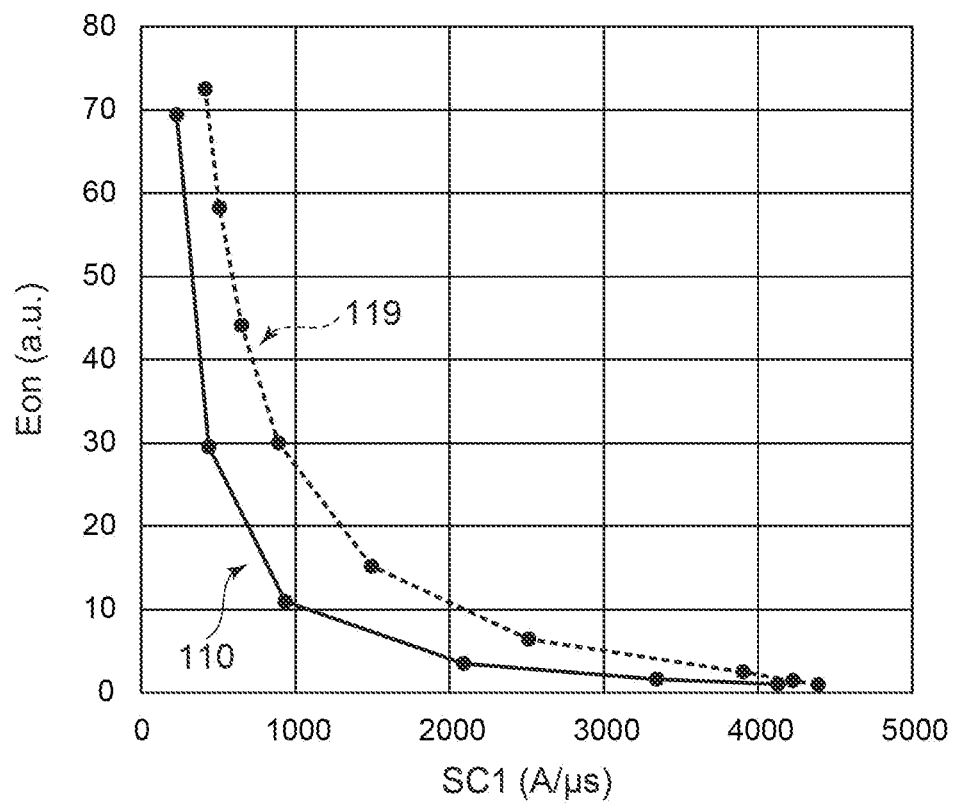
FIG. 11 is a graph illustrating the characteristics of the semiconductor device according to the embodiment.

FIG. 11 is a graph illustrating the characteristics of the semiconductor device according to the embodiment.

The horizontal axis of FIG. 11 is the switching characteristic SC1. The switching characteristic SC1 is a rate of change (di/dt) of the current with respect to time. In this example, the switching characteristic SC1 relates to a change between 20% and 80% in a change in the current. The vertical axis is the on-time loss Eon. FIG. 11 shows characteristics of the semiconductor device 110 and characteristics of the semiconductor device 119 according to the first reference example. As described above, in the first reference example, the third semiconductor region 13 is not provided and the fourth electrode 54 is not provided. In this example, the p-type impurity concentration (carrier concentration) in the third semiconductor region 13 is $5.0 \times 10^{15}$ (cm$^{-3}$). As shown in FIG. 11, in the semiconductor device 110, the trade-off between the on-time loss Eon and the switching characteristic (di/dt) can be improved as compared with the semiconductor device 119.

Figure 12:
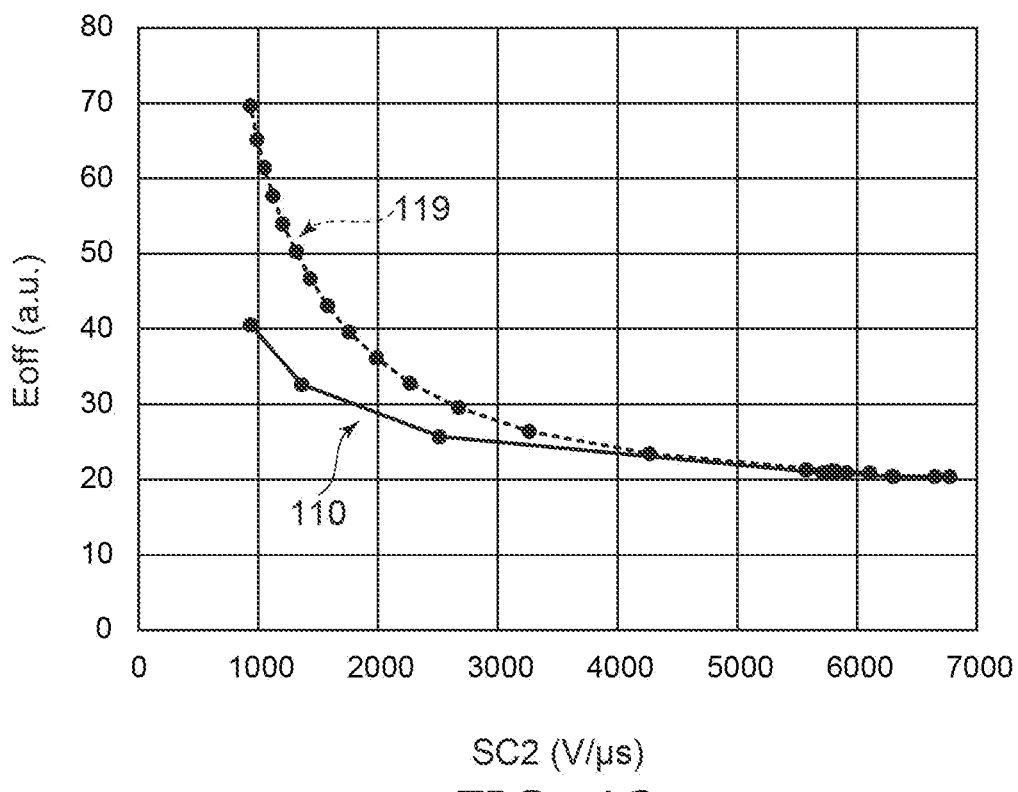
FIG. 12 is a graph illustrating the characteristics of the semiconductor device according to the embodiment.

FIG. 12 is a graph illustrating the characteristics of the semiconductor device according to the embodiment.

The horizontal axis in FIG. 12 is the switching characteristic SC2. The switching characteristic SC2 is a rate of change (dv/dt) of the voltage with respect to time. In this example, the switching characteristic SC2 relates to a change between 20% and 80% in a change in voltage. The vertical axis is the off-time loss Eoff. FIG. 12 shows characteristics of the semiconductor device 110 and characteristics of the semiconductor device 119 according to the first reference example. In this example, the p-type impurity concentration (carrier concentration) in the third semiconductor region 13 is $2.5 \times 10^{15}$ (cm$^{-3}$). As shown in FIG. 12, in the semiconductor device 110, the trade-off between the off-time loss Eoff and the switching characteristic (dv/dt) can be improved as compared with the semiconductor device 119.

As described above, in the embodiment, the trade-off between the on-time loss Eon and the switching characteristic (for example, di/dt) can be improved. For example, on-time loss Eon can be suppressed while maintaining good switching characteristics (for example, di/dt).

In the embodiment, the trade-off between the off-time loss Eoff and the switching characteristic (for example, dv/dt) can be improved. For example, off-time loss Eoff can be suppressed while maintaining good switching characteristics (for example, dv/dt).

Second Embodiment

The second embodiment relates to a drive device for a semiconductor device. The drive device corresponds to the controller 70 described above. The drive device (controller 70) can perform the above operation with respect to the semiconductor device 110.

In the embodiment, the semiconductor member includes, for example, silicon. The semiconductor member may include SiC, GaN, or the like. The first electrode 51 includes, for example, at least one selected from the group consisting of aluminum, nickel and titanium. The second electrode 52 includes, for example, at least one selected from the group consisting of aluminum, nickel and titanium. The third electrode 53 and the fourth electrode 54 include, for example, polycrystalline silicon, amorphous silicon, and the like. The first conductive member 61 includes, for example, at least one selected from the group consisting of aluminum, nickel and titanium. The insulating member 40 includes, for example, oxygen and at least one selected from the group consisting of oxygen and nitrogen.

In the embodiment, the carrier concentration of the first conductive type in the first semiconductor region 11 is, for example, not less than $8.0 \times 10^{11}$/cm$^3$ and not more than $1.3 \times 10^{13}$/cm$^3$. The carrier concentration of the first conductive type in the second semiconductor region 12 is, for example, not less than $1.0 \times 10^{17}$/cm$^3$ and not more than $1.0 \times 10^{21}$/cm$^3$. The carrier concentration of the second conductive type in the third semiconductor region 13 is, for example, not less than $5.0 \times 10^{14}$/cm$^3$ and not more than $1.0 \times 10^{17}$/cm$^3$. The carrier concentration of the second conductive type in the fourth semiconductor region 14 is, for example, not less than $1.0 \times 10^{15}$/cm$^3$ and not more than $1.0 \times 10^{17}$/cm$^3$. The carrier concentration of the first conductive type in the fifth semiconductor region 15 is, for example, not less than $1.0 \times 10^{15}$/cm$^3$ and not more than $2.0 \times 10^{17}$/cm$^3$. The carrier concentration of the second conductive type in the sixth semiconductor region 16 is, for example, not less than $1.0 \times 10^{15}$/cm$^3$ and not more than $1.0 \times 10^{18}$/cm$^3$. The carrier concentration of the first conductive type in the seventh semiconductor region 17 is, for example, not less than $1.0 \times 10^{15}$/cm$^3$ and not more than $1.0 \times 10^{17}$/cm$^3$.

In the embodiment, information regarding the shape of the semiconductor region and the like can be obtained, for example, by observation by an electron microscope. Information on the impurity concentration in the semiconductor region can be obtained by, for example, EDX (Energy Dispersive X-ray Spectroscopy) or SIMS (Secondary Ion Mass Spectrometry). Information on the carrier concentration in the semiconductor region can be obtained by, for example, SCM (Scanning Capacitance Microscopy).

The embodiments may include the following configurations (for example, technical proposals).

Configuration 1

A semiconductor device, comprising:
a first electrode;
a semiconductor member including a first semiconductor region being of a first conductive type, a second semiconductor region being of the first conductive type, a third semiconductor region being of a second conductive type, a fourth semiconductor region being of the second conductive type, a fifth semiconductor region being of the first conductive type, and a sixth semiconductor region being of the second conductive type, a position of the first semiconductor region in a first direction from the first electrode to the first semiconductor region being located between a position of the first electrode in the first direction and a position of the second semiconductor region in the first direction, the third semiconductor region including a first partial region and a second partial region, the second partial region being located between the first semiconductor region and the second semiconductor region in the first direction, at least a part of the fourth semiconductor region being located between the second partial region and the second semiconductor region in the first direction, the fifth semiconductor region being located between the second partial region and at least a part of the fourth semiconductor region in the first direction, the sixth semiconductor region being located between the first electrode and the first semiconductor region in the first direction;
a second electrode electrically connected to the second semiconductor region;
a third electrode, the first partial region being located between the first semiconductor region and the third electrode in the first direction, the third electrode overlapping the second semiconductor region, at least a part of the fourth semiconductor region, and the fifth semiconductor region in a second direction crossing the first direction;
a fourth electrode, the fourth electrode being located between the first partial region and the third electrode in the first direction, a direction from the fourth electrode to the second partial region being along the second direction; and
an insulating member, at least a part of the insulating member being provided between the semiconductor member and the third electrode, between the semiconductor member and the fourth electrode, and between the third electrode and the fourth electrode.

Configuration 2

The semiconductor device according to configuration 1, wherein the third electrode does not overlap the second partial region in the second direction.

Configuration 3

The semiconductor device according to configuration 1 or 2, wherein the insulating member including a first insulating region provided between the third electrode and the fourth electrode,
the first insulating region overlaps a part of the fifth semiconductor region in the second direction, and
the first insulating region does not overlap the third semiconductor region in the second direction.

Configuration 4

The semiconductor device according to any one of configurations 1-3, wherein a second distance between the fourth electrode and the third electrode along the first direction is not less than 10 nm and not more than 360 nm.

Configuration 5

The semiconductor device according to any one of configurations 1-3, wherein
the semiconductor member includes a first boundary between the second partial region and the fifth semiconductor region,
the fourth electrode includes a second end portion on a side of the third electrode side, and
a first distance along the first direction between a position of the first boundary in the first direction and a position of the second end in the first direction is not less than 10 nm and not more than 200 nm.

Configuration 6

The semiconductor device according to any one of configurations 1-5, wherein a carrier concentration of the first conductive type in the second semiconductor region is higher than a carrier concentration of the first conductive type in the first semiconductor region.

Configuration 7

The semiconductor device according to configuration 6, wherein a carrier concentration of the first conductive type in the fifth semiconductor region is higher than the carrier concentration of the first conductive type in the first semiconductor region.

Configuration 8

The semiconductor device according to configuration 6 or 7, wherein
the semiconductor member further includes a seventh semiconductor region being of the first conductive type,
the seventh semiconductor region is located between the sixth semiconductor region and the first semiconductor region in the first direction, and
a carrier concentration of the first conductive type in the seventh semiconductor region is higher than the carrier concentration of the first conductive type in the first semiconductor region.

Configuration 9

The semiconductor device according to any one of configurations 1-8, further comprising: a first conductive member, at least a part of the second partial region being located between the fourth electrode and a part of the first conductive member in the second direction, at least a part of the fifth semiconductor region and the fourth semiconductor region being located between the third electrode and an other part of the first conductive member in the second direction, the first conductive member being electrically insulated from the third electrode and being electrically insulated from the fourth electrode, and a part of the insulating member being provided between the semiconductor member and the first conductive member.

Configuration 10

The semiconductor device according to configuration 9, wherein
the first conductive member includes a first conductive portion and a second conductive portion,
at least a part of the second partial region is between the fourth electrode and the second conductive portion in the second direction, and
the at least the part of the fifth semiconductor region and the fourth semiconductor region are located between the third electrode and the first conductive portion in the second direction.

Configuration 11

The semiconductor device according to configuration 9 or 10, wherein a part of the fourth semiconductor region is located between the second semiconductor region and the first conductive member in the second direction.

Configuration 12

The semiconductor device according to configuration 11, wherein a part of the insulating member is in contact with the part of the fourth semiconductor region and the first conductive member.

Configuration 13

The semiconductor device according to any one of configurations 1-12, further comprising:
a controller configured to supply a first drive signal to the third electrode and to supply a second drive signal to the fourth electrode,
in a first operation, the first drive signal being configured to change from a first potential to a second potential higher than the first potential, and
in the first operation, the second drive signal being configured to change from a third potential to a fourth potential higher than the third potential.

Configuration 14

The semiconductor device according to configuration 13, wherein a first time when the first drive signal changes from the first potential to the second potential is prior to a second time when the second drive signal changes from the third potential to the fourth potential.

Configuration 15

The semiconductor device according to configuration 14, wherein an absolute value of a difference between the first time and the second time is not less than 2 μs and not more than 5 μs.

Configuration 16

The semiconductor device according to any one of configurations 13-15, wherein
in a second operation, the first drive signal changes from the second potential to the first potential, and
in the second operation, the second drive signal changes from the fourth potential to the third potential.

Configuration 17

The semiconductor device according to configuration 16, wherein a third time when the first drive signal changes from the second potential to the first potential is after a fourth time when the second drive signal changes from the fourth potential to the third potential.

Configuration 18

The semiconductor device according to configuration 17, wherein an absolute value of a difference between the third time and the fourth time is 3 μs or less.

Configuration 19

The semiconductor device according to any one of configurations 13-18, wherein
the third potential is substantially the same as the first potential, and
the fourth potential is substantially the same as the second potential.

Configuration 20

The semiconductor device according to any one of configurations 1-19, wherein a length of the third electrode along the first direction is longer than a length of the fourth electrode along the first direction.

According to the embodiment, it is possible to provide a semiconductor device capable of suppressing loss.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as electrodes, semiconductor members, insulating members, conductive members, insulating portions, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode;
   a semiconductor member including a first semiconductor region being of a first conductive type, a second semiconductor region being of the first conductive type, a third semiconductor region being of a second conductive type, a fourth semiconductor region being of the second conductive type, a fifth semiconductor region being of the first conductive type, and a sixth semiconductor region being of the second conductive type, a position of the first semiconductor region in a first direction from the first electrode to the first semiconductor region being located between a position of the first electrode in the first direction and a position of the second semiconductor region in the first direction, the third semiconductor region including a first partial region and a second partial region, the second partial region being located between the first semiconductor region and the second semiconductor region in the first direction, at least a part of the fourth semiconductor region being located between the second partial region and the second semiconductor region in the first direction, the fifth semiconductor region being located between the second partial region and at least a part of the fourth semiconductor region in the first direction, The sixth semiconductor region being located between the first electrode and the first semiconductor region in the first direction;
   a second electrode electrically connected to the second semiconductor region;
   a third electrode, the first partial region being located between the first semiconductor region and the third electrode in the first direction, the third electrode overlapping the second semiconductor region, at least a part of the fourth semiconductor region, and the fifth semiconductor region in a second direction crossing the first direction;
   a fourth electrode, the fourth electrode being located between the first partial region and the third electrode in the first direction, a direction from the fourth electrode to the second partial region being along the second direction; and
   an insulating member, at least a part of the insulating member being provided between the semiconductor member and the third electrode, between the semiconductor member and the fourth electrode, and between the third electrode and the fourth electrode.

2. The device according to claim 1, wherein the third electrode does not overlap the second partial region in the second direction.

3. The device according to claim 1, wherein
   the insulating member including a first insulating region provided between the third electrode and the fourth electrode,
   the first insulating region overlaps a part of the fifth semiconductor region in the second direction, and
   the first insulating region does not overlap the third semiconductor region in the second direction.

4. The device according to claim 1, wherein a second distance between the fourth electrode and the third electrode along the first direction is not less than 10 nm and not more than 360 nm.

5. The device according to claim 1, wherein
   the semiconductor member includes a first boundary between the second partial region and the fifth semiconductor region,
   the fourth electrode includes a second end portion on a side of the third electrode side, and
   a first distance along the first direction between a position of the first boundary in the first direction and a position of the second end in the first direction is not less than 10 nm and not more than 200 nm.

6. The device according to claim 1, wherein a carrier concentration of the first conductive type in the second semiconductor region is higher than a carrier concentration of the first conductive type in the first semiconductor region.

7. The device according to claim 6, wherein a carrier concentration of the first conductive type in the fifth semiconductor region is higher than the carrier concentration of the first conductive type in the first semiconductor region.

8. The device according to claim 6, wherein
   the semiconductor member further includes a seventh semiconductor region being of the first conductive type,
   the seventh semiconductor region is located between the sixth semiconductor region and the first semiconductor region in the first direction, and
   a carrier concentration of the first conductive type in the seventh semiconductor region is higher than the carrier concentration of the first conductive type in the first semiconductor region.

9. The device according to claim 1, further comprising a first conductive member,
   at least a part of the second partial region being located between the fourth electrode and a part of the first conductive member in the second direction,
   at least a part of the fifth semiconductor region and the fourth semiconductor region being located between the third electrode and an other part of the first conductive member in the second direction,
   the first conductive member being electrically insulated from the third electrode and being electrically insulated from the fourth electrode, and
   a part of the insulating member being provided between the semiconductor member and the first conductive member.

10. The device according to claim 9, wherein
    the first conductive member includes a first conductive portion and a second conductive portion,
    at least a part of the second partial region is between the fourth electrode and the second conductive portion in the second direction, and the at least the part of the fifth semiconductor region and the fourth semiconductor region are located between the third electrode and the first conductive portion in the second direction.

11. The device according to claim 9, wherein a part of the fourth semiconductor region is located between the second semiconductor region and the first conductive member in the second direction.

12. The device according to claim 11, wherein a part of the insulating member is in contact with the part of the fourth semiconductor region and the first conductive member.

13. The device according to claim 1, further comprising:
a controller configured to supply a first drive signal to the third electrode and to supply a second drive signal to the fourth electrode,
in a first operation, the first drive signal being configured to change from a first potential to a second potential higher than the first potential, and
in the first operation, the second drive signal being configured to change from a third potential to a fourth potential higher than the third potential.

14. The device according to claim 13, wherein a first time when the first drive signal changes from the first potential to the second potential is prior to a second time when the second drive signal changes from the third potential to the fourth potential.

15. The device according to claim 14, wherein an absolute value of a difference between the first time and the second time is not less than 2 μs and not more than 5 μs.

16. The device according to claim 13, wherein
in a second operation, the first drive signal changes from the second potential to the first potential, and
in the second operation, the second drive signal changes from the fourth potential to the third potential.

17. The device according to claim 16, wherein a third time when the first drive signal changes from the second potential to the first potential is after a fourth time when the second drive signal changes from the fourth potential to the third potential.

18. The device according to claim 17, wherein an absolute value of a difference between the third time and the fourth time is 3 μs or less.

19. The device according to claim 13, wherein
the third potential is substantially the same as the first potential, and
the fourth potential is substantially the same as the second potential.

20. The device according to claim 1, wherein a length of the third electrode along the first direction is longer than a length of the fourth electrode along the first direction.

* * * * *